United States Patent [19]
Bunton et al.

[11] Patent Number: 5,203,004
[45] Date of Patent: Apr. 13, 1993

[54] MULTI-BOARD SYSTEM HAVING ELECTRONIC KEYING AND PREVENTING POWER TO IMPROPERLY CONNECTED PLUG-IN BOARD WITH IMPROPERLY CONFIGURED DIODE CONNECTIONS

[75] Inventors: William P. Bunton, New Braunfels; John M. Brown, Leander; Patricia L. Whiteside, Austin, all of Tex.

[73] Assignee: Tandem Computers Incorporated, Cupertino, Calif.

[21] Appl. No.: 464,817

[22] Filed: Jan. 8, 1990

[51] Int. Cl.[5] .......................... G06F 1/26; G06F 15/08
[52] U.S. Cl. ........................................ 395/800; 439/43; 439/49; 439/93; 439/133; 307/140; 361/1
[58] Field of Search .................... 395/800 MS File; 439/43, 49, 133, 488, 489, 491, 93, 500, 510; 307/140; 361/1

[56] References Cited

U.S. PATENT DOCUMENTS

| | | | |
|---|---|---|---|
| 3,602,900 | 8/1971 | Delaigue et al. | 340/172.5 |
| 3,660,831 | 5/1972 | Nicola et al. | 340/274 |
| 3,673,467 | 6/1972 | Eisenreich | 317/134 |
| 3,681,578 | 8/1972 | Stevens | 235/153 |
| 3,735,356 | 5/1973 | Yates | 340/172.5 |
| 3,757,305 | 9/1973 | Hedin | 340/164 R |
| 3,761,884 | 9/1973 | Avsan et al. | 340/172.5 |
| 3,787,714 | 1/1974 | Resnick et al. | 317/134 |
| 3,810,119 | 5/1974 | Zieve et al. | 340/172.5 |
| 3,828,321 | 8/1974 | Wilber et al. | 340/172.5 |
| 3,833,798 | 9/1974 | Huber et al. | 235/153 |
| 3,848,116 | 11/1974 | Moder et al. | 235/153 |
| 3,921,149 | 11/1975 | Kreis et al. | 340/172.5 |
| 4,015,243 | 3/1977 | Kurpanek et al. | 340/172.5 |
| 4,015,246 | 3/1977 | Hopkins, Jr. et al. | 340/172.5 |
| 4,034,347 | 7/1977 | Probert, Jr. | 364/200 |
| 4,187,538 | 2/1980 | Douglas et al. | 364/200 |
| 4,224,664 | 9/1980 | Trinchieri | 364/200 |
| 4,228,496 | 10/1980 | Katzman et al. | 364/200 |
| 4,253,144 | 2/1981 | Bellamy et al. | 364/200 |
| 4,257,097 | 3/1981 | Moran | 364/200 |
| 4,315,310 | 2/1982 | Bayliss et al. | 364/200 |
| 4,316,245 | 2/1982 | Luu et al. | 364/200 |
| 4,321,666 | 3/1982 | Taser et al. | 364/200 |
| 4,330,826 | 5/1982 | Whiteside et al. | 364/200 |
| 4,375,683 | 3/1983 | Wensley | 371/36 |
| 4,377,315 | 3/1983 | Grau | 339/17 |
| 4,380,046 | 4/1983 | Fung | 364/200 |
| 4,392,196 | 7/1983 | Glenn et al. | 364/200 |

(List continued on next page.)

FOREIGN PATENT DOCUMENTS 2183114 5/1987 United Kingdom.
WO8502698 6/1985 World Int. Prop. O..

OTHER PUBLICATIONS

BiiN 60 TM System Technical Overview.
Cohen, E. I., et al., "Storage Hierarchies", IBM Systems Journal, 1989.

(List continued on next page.)

Primary Examiner—Thomas C. Lee
Assistant Examiner—Paul Harrity
Attorney, Agent, or Firm—Lawrence W. Granatelli

[57] ABSTRACT

A computer system with a number of subsystems or modules on separate circuit boards employs electronic keying to ensure proper configuration of these boards. A power key arrangement associated with a plug-in connector enables a separate power supply for each set of boards. A power supply turn-on signal is routed through a uniquely-configured connector path for each board, so the power supply turn-on is inhibited for improper configurations. The uniquely-configured connector path may use either a series or a parallel implementation. The series implementation employs a set of diodes connected for conduction in either of two directions, with the mating connector having its conductor paths connected to match the diode configuration; in this manner, the power supply enable signal can only flow through the series path if the proper board is plugged into a properly-coded slot, in which case the power supply to activate this board is activated through the series path including the diodes. The parallel implementation employs a given number of connector pins to establish the coding for each board, and each pin is either open-circuited or connected to ground; if this coding of the subsystem board is not the same as that of the slot into which it is plugged then the power supply activation signal will be shorted to ground by one or the other of the coded pins.

3 Claims, 2 Drawing Sheets

U.S. PATENT DOCUMENTS

| | | | |
|---|---|---|---|
| 4,392,199 | 7/1983 | Schmitter et al. | 364/200 |
| 4,399,504 | 8/1983 | Obermarck et al. | 364/200 |
| 4,402,045 | 8/1983 | Krol | 364/200 |
| 4,412,218 | 10/1983 | Niitsu | 340/825.56 |
| 4,412,281 | 10/1983 | Works | 364/200 |
| 4,414,624 | 11/1983 | Summer, Jr. et al. | 364/200 |
| 4,426,681 | 1/1984 | Bacot et al. | 364/200 |
| 4,430,707 | 2/1984 | Kim | 364/200 |
| 4,432,051 | 2/1984 | Bogaert et al. | 364/200 |
| 4,453,215 | 6/1984 | Reid | 364/200 |
| 4,455,605 | 6/1984 | Cormier et al. | 364/200 |
| 4,468,612 | 8/1984 | Starr | 324/66 |
| 4,493,019 | 1/1985 | Kim et al. | 364/200 |
| 4,497,059 | 1/1985 | Smith | 371/36 |
| 4,504,821 | 3/1985 | Barnes | 340/146.2 |
| 4,541,094 | 9/1985 | Stiffler et al. | 371/68 |
| 4,564,903 | 1/1986 | Guyette et al. | 364/300 |
| 4,570,261 | 2/1986 | Maher | 371/16 |
| 4,577,272 | 3/1986 | Ballew et al. | 364/200 |
| 4,589,066 | 5/1986 | Lam et al. | 364/200 |
| 4,591,977 | 5/1986 | Nissen et al. | 364/200 |
| 4,597,084 | 6/1986 | Dynneson et al. | 371/51 |
| 4,607,365 | 8/1986 | Greig et al. | 371/8 |
| 4,616,312 | 10/1986 | Uebel | 364/200 |
| 4,633,394 | 12/1986 | Georgiou et al. | 364/200 |
| 4,638,427 | 1/1987 | Martin | 364/200 |
| 4,644,498 | 2/1987 | Bedard et al. | 364/900 |
| 4,646,231 | 2/1987 | Green et al. | 364/200 |
| 4,648,035 | 3/1987 | Fava et al. | 364/200 |
| 4,654,857 | 3/1987 | Samson et al. | 371/68 |
| 4,661,900 | 4/1987 | Chen et al. | 364/200 |
| 4,667,287 | 5/1987 | Allen et al. | 364/200 |
| 4,672,535 | 6/1987 | Katzman et al. | 364/200 |
| 4,675,769 | 6/1987 | Marshall et al. | 361/1 |
| 4,683,570 | 7/1987 | Bedard et al. | 371/36 |
| 4,703,452 | 10/1987 | Abrant et al. | 364/900 |
| 4,709,325 | 11/1987 | Yajima | 364/200 |
| 4,733,353 | 3/1988 | Jaswa | 364/200 |
| 4,751,639 | 6/1988 | Corcoran et al. | 364/200 |
| 4,757,442 | 7/1988 | Sakata | 364/200 |
| 4,774,709 | 9/1988 | Tulplue et al. | 371/11 |
| 4,775,930 | 10/1988 | Clawson et al. | 395/575 |
| 4,779,008 | 10/1988 | Kessels | 307/269 |
| 4,783,731 | 11/1988 | Miyazaki et al. | 364/200 |
| 4,783,733 | 11/1988 | Greig et al. | 364/200 |
| 4,785,453 | 11/1988 | Chandran et al. | 371/68 |
| 4,794,601 | 12/1988 | Kikuchi | 371/36 |
| 4,799,140 | 1/1989 | Dietz et al. | 364/140 |
| 4,800,462 | 1/1989 | Zacher et al. | 361/413 |
| 4,805,107 | 2/1989 | Kieckhafer et al. | 364/200 |
| 4,819,159 | 4/1989 | Shipley et al. | 364/200 |
| 4,827,401 | 5/1989 | Hrustich et al. | 364/200 |
| 4,831,520 | 5/1989 | Rubinfeld et al. | 364/200 |
| 4,847,837 | 7/1989 | Morales et al. | 371/8 |
| 4,849,979 | 7/1989 | Maccianti et al. | 371/68 |
| 4,853,872 | 8/1989 | Shimoi | 364/300 |
| 4,868,818 | 9/1989 | Madan et al. | 371/11.3 |
| 4,868,826 | 9/1989 | Smith et al. | 371/9.1 |
| 4,873,685 | 10/1989 | Millis, Jr. | 371/3 |
| 4,879,716 | 11/1989 | McNally et al. | 371/8.2 |
| 4,912,698 | 3/1990 | Bitzinger et al. | 370/13 |
| 4,914,657 | 4/1990 | Walter et al. | 371/11.3 |
| 4,933,940 | 6/1990 | Walter et al. | 371/9.1 |
| 4,942,358 | 7/1990 | Davis et al. | 324/158 R |

OTHER PUBLICATIONS

"Computer System Isolates Faults", Computer Design, Nov. 1983.

Davies, D., et al., "Synchronization and Matching in Redundant Systems", IEEE 1978.

Enslow, P. H., Editor, "Multiprocessors and Parallel Processing", Comtre Corp., John Wiley & Sons, 1974.

Frison, S. G., et al., "Interactive Consistency and Its Impact on the Design of TMR Systems", August Systems, Inc., IEEE 1982.

Hopkins, A. L., "A Fault-Tolerant Information Processing Concept for Space Vehicles", IEEE Transactions on Computers, Nov. 1971.

Kilmer, F., et al., "Comparison of Synchronization Techniques for Redundant Computer Sets", IBM Fed. Sys. Div., Mar. 1974.

McConnel, S. R., et al., "Synchronization and Voting", IEEE Transactions on Computers, vol. C-30, No. 2, Feb. 1981.

McCluskey, E. J., et al., "Comparative Architecture of High-Availability Computer Systems", IEEE, Digest of Papers, COMP-CON, Spring 1977.

NCR 9800 System Technical Overview.

Sklaroff, J. R., "Redundancy Management Technique for Space Shuttle Computers", IBM J. Res. Develop., Jan. 1976.

Smith, B. T., et al., "Architectural Description of a Fault-Tolerant Multiprocessor Engineering Prototype", IEEE Computer Soc., FTCS-8, Jun. 1978.

Smith, B. T., "High-Performance Fault-Tolerant Real-Time Computer Architecture", IEEE 1986.

Tolerant Systems, "Eternity TM Series System Summary", Rev. 2.0, Jan. 1984.

Weinstock, C. B., "SIFT:Systems Design and Implementation", IEEE 1980.

Wensley, J. H., "Fault-Tolerant Systems Can Prevent Timing Problems", Computer Design, Nov. 1982.

Yoneda, T., et al., "Implementation of Interrupt Handler for Loosely-Synchronized TMR Systems", IEEE 1985.

MULTI-BOARD SYSTEM HAVING ELECTRONIC KEYING AND PREVENTING POWER TO IMPROPERLY CONNECTED PLUG-IN BOARD WITH IMPROPERLY CONFIGURED DIODE CONNECTIONS

BACKGROUND OF THE INVENTION

This invention relates to connection arrangements for electrical or electronic assemblies, and more particularly to a method for ensuring proper configuration of computer systems having multiple boards.

Computers are usually constructed using a number of printed circuit boards or the like. While in some cases a system may have a number of universal type of slots (generic slots) where a variety of different circuit boards having different construction and function may be plugged into these slots, there are in most systems specific slots that can only accommodate unique circuit boards (modules or sub-systems) constructed for these specific slots, i.e., the boards are not interchangeable. Traditionally, a way of making sure the right circuit board is plugged into the right slot is by use of mechanical keying such as plugged pins, asymmetrical guide pins, etc. Such types of keying dedicates board slots to specialized functions, rendering them useless for any alternate functions. Another approach to multi-board systems is to use generic slots without mechanical keying, but this approach restricts the use of I/O pins by forcing dedication of function, or is vulnerable to damaging the circuitry on a board if improperly configured. That is, if a board is inserted into the wrong slot its circuitry may be damaged by application of voltages to the wrong conductors.

In a fault-tolerant computer system of the type set forth in copending U.S. patent applications Ser. Nos. 282,469, 282,538 filed Dec. 9, 1988 subsequently abandoned in favor of continuation application Ser. No. 517,533 filed Apr. 25, 1990; and Ser. No. 282,540 filed Dec. 9, 1988 subsequently abandoned in favor of continuation application Ser. No. 629,698 filed Dec. 17, 1990 and allowed; and Ser. No. 282,629 filed Dec. 9, 1988 subsequently abandoned in favor of continuation application Ser. No. 666,495 filed Mar. 6, 1991; and Ser. No. 283,139 filed Dec. 9, 1988 subsequently abandoned in favor of continuation application Ser. No. 737,937 filed Jul. 29, 1991; and Ser. No. 283,141 filed Dec. 9, 1988 subsequently abandoned in favor of continuation application Ser. No. 722,609 filed Jun. 26, 1991; all filed Dec. 9, 1988, and assigned to Tandem Computers Incorporated, each module of the system (such as a CPU, a memory module, or an I/O processor) has its own separately-controllable independent power supply. In this type of system, proper configuration of multi-board subsystems can be guaranteed by employing an electronic keying arrangement instead of a mechanical key; here the power supply to a subsystem on a board is keyed electronically to prevent power from being applied unless the configuration is correct.

SUMMARY OF THE INVENTION

In accordance with one embodiment of the invention, a computer system or the like has a number of subsystems or modules on separate circuit boards, and proper configuration of these boards is ensured by a power key arrangement enabling a separate power supply for each set of boards. A power supply turn-on signal is routed through a uniquely-configured connector path for each board, so the power supply turn-on is inhibited for improper configurations. The uniquely-configured connector path may use either a series or a parallel implementation. The series implementation employs a set of diodes connected for conduction in either of two direction with the mating connector having its conductor paths connected to match the diode configuration; in this manner, the power supply enable signal can only flow through the series path if the proper board is plugged into a properly-coded slot, in which case the power supply to activate this board is activated through the series path including the diodes. The parallel implementation employs a given number of connector pins to establish the coding for each board, and each pin is either open-circuited or connected to ground; if this coding of the subsystem board is not the same as that of the slot into which it is plugged then the power supply activation signal will be shorted to ground by one or the other of the coded pins.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENT

Figure 1:
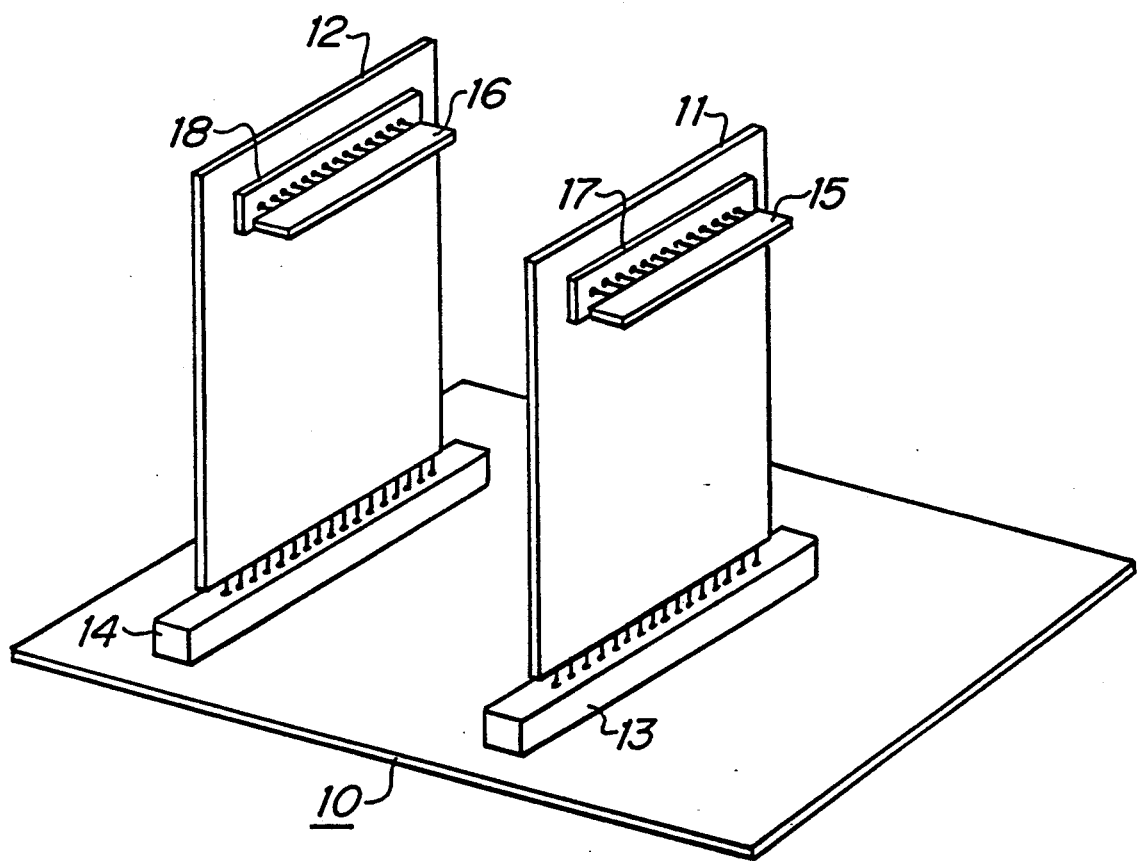
FIG. 1 is a pictorial view of a multi-board system employing plug-in connectors between boards as may be employed in a computer system or the like utilizing features of the invention.

Referring to FIG. 1, a computer system or the like is usually constructed with a number of circuit boards including a so-called motherboard or backplane 10 and additional boards 11 and 12 plugged into the motherboard using edge connectors 13 and 14. Daughterboards 15 and 16 may be plugged into the boards 11 and 12 by edge connectors 17 and 18. Of course, other types of connectors could be used, such as cable connectors or the like, and the features of the invention are applicable as well to other types of system components or modules, such as integrated circuit packages of the dual-in-line or pin-grid array types, surface-mount configurations, etc.

The plug-in type connectors such as the edge connectors 13, 14, 17 or 18, or other such connectors, are of standard off-the-shelf configurations, so it is mechanically possible to insert a board 11, 12, 15 or 16 into the wrong slot. In computer systems employing standard bus configurations, this error is of no consequence because the slots are intentionally interchangeable. However, in a system of the type shown in the above-mentioned copending applications, for example, where the boards or modules are preferably not interchangeable, the board plugged into a given slot must be the specific board designed for that particular slot. Another board erroneously plugged onto that slot may cause one or both boards to be damaged by improper voltages being applied, or may cause the system to operate improperly.

Figure 2:
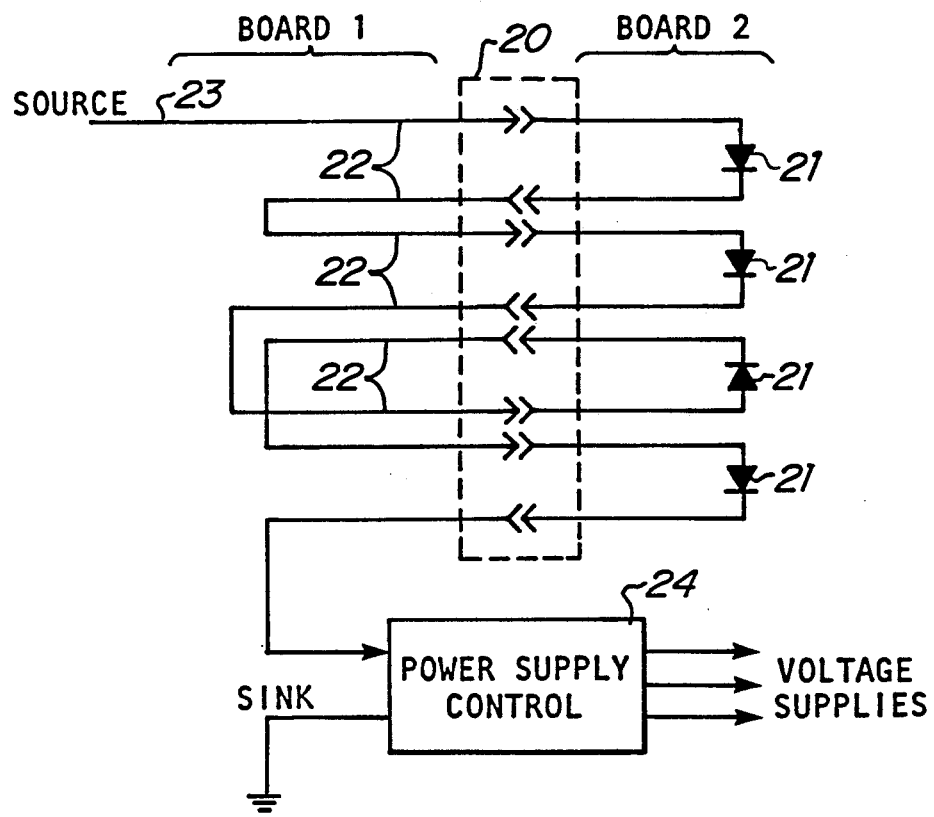
FIG. 2 is an electrical schematic diagram of a power keying arrangement according to one embodiment of the invention employing a series circuit configuration.

Referring to FIG. 2, the connections for an electronic keying circuit are illustrated according to a series-circuit embodiment of the invention. A connector 20, corresponding to one of the edge-connectors 13, 14, 15 or 16 of FIG. 1, for example, is used for connecting board-1 to board-2 in the system. Board-1 may be a back plane or motherboard, for example, or it may be one of the modules themselves. Board-2 is a board plugged into board-1, generally as seen in FIG. 1. Each one of the boards has a great deal of other circuitry thereon, making up the system of the computer, but only the circuitry relating to the power keying is illustrated. Connected to the connector pins of the connector 20 on the board-2 side are a set of diodes 21 which are poled for conduction in one direction or the other according to a code unique for this board-2. Four diodes 21 are shown, but there may be eight, for example, depending upon the number of unique codes needed (e.g., the number of boards in the system). The number of possible combinations is $2^n$, where n is the number of diodes. Thus, when four diodes 21 are employed there are sixteen code combinations, while eight diodes allows 256 combinations. The conductors 22 on the board-1 side of the connector 20 are wired to correspond to the directions the diodes 21 are positioned so that current will flow in a forward direction through the diodes from a source 23 to a power-supply controller 24. If the wiring on the board-1 side does not correspond to the coding of the diodes 21 on the board-2 side of the connector 20, however, the series path is blocked by one or more reverse-connected diodes and so the source 23 is not connected to the controller 24 and the power supply 24 is not activated. The controller 24 may be located on the board-1, or elsewhere in the system. The power supply operated by the controller 24 is coupled to the board-2 by other conductors of the connector 20, for example, or by a separate connector; alternatively, the power supply controller 24 may be supplying power to both board-1 and board-2 so neither of these will be activated unless the proper configuration is present.

Figure 3:
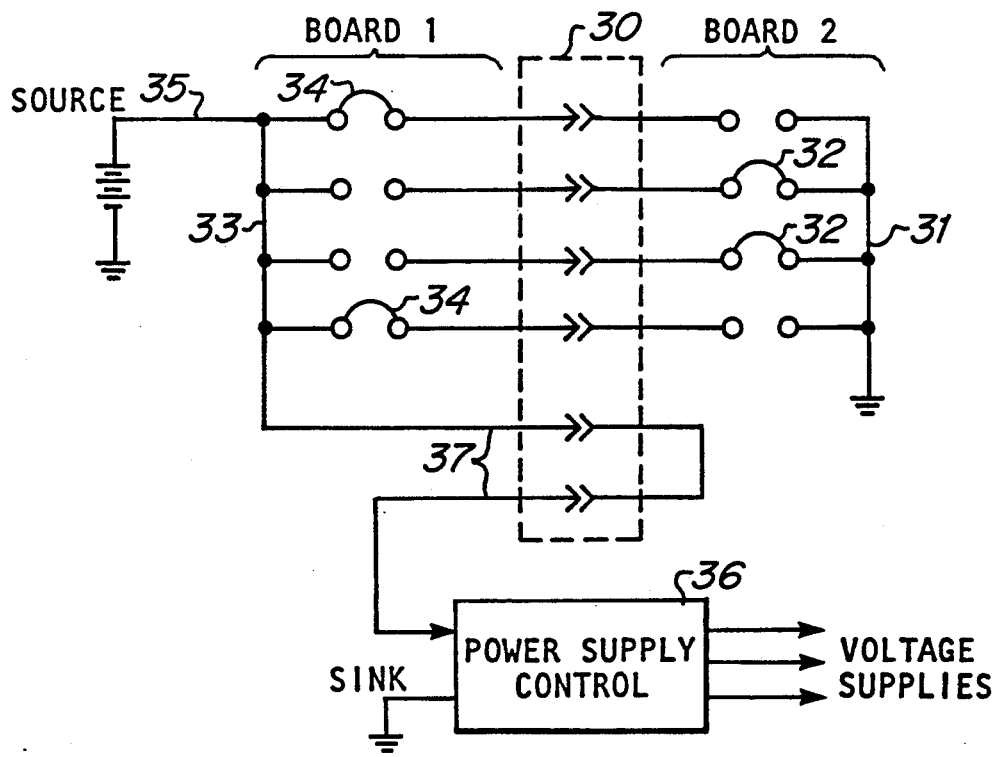
FIG. 3 is an electrical schematic diagram of a power keying arrangement according to another embodiment of the invention employing a parallel circuit configuration.

Referring to FIG. 3, a parallel arrangement for the power supply keying circuitry of the invention is illustrated, according to another embodiment. A connector 30, in a manner similar to that of FIG. 2, connects board-1 and board-2. On the board-2 side of the connector 30, each of the connector pins used for the unique code is either connected to a ground terminal 31, or not, by jumpers 32. A four-bit code is illustrated for simplicity (with jumpers 32 for two-of-four), but more likely an eight-bit code would be needed. This is an "n of m" code, where there will be a fixed number n of grounding jumpers 32 for the m conductor pins. On the board-1 side, corresponding connector pins are connected to a line 33 by jumpers 34, in this case coded to be the complement of that of the jumpers 32 on the board-2 side. If the wrong board (coded so it doesn't match) is connected to the connector 30, then the line 33 is shorted to ground terminal 31, but if the correct board-2 is connected then no connection to ground is completed. As before, a source 35 is connected by the line 33 to the input of a power supply controller 36 so that an activating signal from the source only reaches the power supply controller if the properly-coded board-2 connector is plugged into the connector 30. Additional connector pins 37 create a series circuit between the line 33 and the input of the controller 36 so that the activating signal does not reach the controller when no board-2 at all is plugged in.

The series configuration of FIG. 2 requires that a sufficient voltage must be available at the source 23 to overcome the forward drop through the four (or eight) diodes 21, plus any IR drops in the series circuit, and still provide an activating voltage to the controller 24. The parallel configuration of FIG. 3 can operate on a lower potential due to fewer forward drops, but the "n of m" code is not as easy to manage when a large number of boards are to be accounted for.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A computer system having a first board and at least one module, said module having a plug-in assembly for connection to said first board, and an electrical keying circuit to prevent operation of said module unless properly-configured by said plug-in assembly, said keying circuit comprising:

a) a plurality of connector elements located upon said module to engage a like plurality of connector elements located upon said first board;

b) a plurality of uniquely-configured connections on said module separately engaging said plurality of connector elements to define a key configuration different from any other of said modules wherein each one of said uniquely-configured connections includes a diode connected between a pair of said plurality of connector elements for conduction in either a first or a second direction; and c) an electrical circuit on at least one of said first board and said module for supplying enabling voltage to said module, said electrical circuit for said module engaging said plurality of connector elements on said first board in a unique pattern to prevent supplying said enabling voltage unless said module is connected and properly configured by said plug-in assembly to said first board; wherein said electrical circuit for said module includes said unique pattern to enable a series connection through said diodes in a manner such that all of the diodes for said module are connected in the same direction for conduction of current.

2. A computer system having a system board and a number of modules, each of said modules having a separate plug-in assembly for connection to said system board, and an electrical keying circuit to prevent operation of said modules unless properly-configured by said plug-in assembly, said keying circuit comprising:

a) a plurality of connector elements located upon each said module to engage a like plurality of connector elements located upon said system board;

b) a plurality of uniquely-configured connections on each said module separately engaging said plurality of connector elements to define a key configuration different from other ones of said modules wherein each one of said uniquely-configured connections includes a diode connected between a pair of said plurality of connector elements for conduction in either a first or a second direction;

c) an electrical circuit on at least one of said system board and said module for supplying enabling voltage to each one of said modules, said electrical circuit for each module engaging said plurality of connector elements on said system board in a unique pattern to prevent supplying said enabling voltage unless the proper one of said modules is connected by the proper one of said plug-in assemblies to said system board; wherein said electrical circuit for each said module includes said unique pattern to enable a series connection through said diodes in a manner such that all of the diodes for a module are connected in the same direction for conduction of current.

3. A method of operating a computer system having a first board and at least one module, said module having a plug-in assembly for connection to said first board, to prevent operation of said module unless properly-configured by said plug-in assembly, the method comprising the steps of:

a) coupling a plurality of connector elements located upon said module to engage a like plurality of connector elements located upon said first board;

b) configuring a plurality of unique connections on said module to separately engage said plurality of connector elements to define a key configuration different from any other of said modules wherein each one of said unique connections includes a diode connected between a pair of said connector elements for conduction in either a first or a second direction; and c) supplying enabling voltage to said module by an electrical circuit on at least one of said first board and said module, said module engaging said plurality of connector elements on said first board in a unique pattern to prevent supplying said enabling voltage unless said module is connected and properly configured by said plug-in assembly to said first board; wherein said electrical circuit for said module includes said unique pattern to enable a series connection through said diodes in a manner such that all of the diodes for said module are connected in the same direction for conduction of current.

* * * * *